United States Patent [19]

Simison et al.

[11] Patent Number: 4,724,421

[45] Date of Patent: Feb. 9, 1988

[54] TIME INTERVAL TO DIGITAL CONVERTER WITH SMOOTHING

[75] Inventors: Paul C. Simison, Phoenix; Howard P. Greaves, Glendale, both of Ariz.

[73] Assignee: Honeywell Inc., Minneapolis, Minn.

[21] Appl. No.: 938,946

[22] Filed: Dec. 8, 1986

[51] Int. Cl.⁴ ........................ H03M 1/00; H03M 1/50

[52] U.S. Cl. ................................ 340/347 R; 375/22; 377/20; 377/45

[58] Field of Search .................... 340/347 R, 347 AD; 375/22; 377/20, 45; 307/234; 378/111

[56] References Cited

U.S. PATENT DOCUMENTS 4,178,549 12/1979 Ledenbach ............................ 375/22

4,575,865 3/1986 Dackow ................................ 377/20

*Primary Examiner*—Charles D. Miller

*Attorney, Agent, or Firm*—Seymour Levine; Albin Medved

[57] ABSTRACT

An up/down tracking counter stores a digital count signal equal to the time interval to be converted and provides this signal as the parallel digital output of the converter. Prior to the interval to be converted the count from the up/down counter is loaded into a down counter. At the leading edge of the interval to be converted the down counter is counted down, from the count loaded therein, by a clock signal until the occurrence of the trailing edge of the interval. A decision PROM responsive to the output of the down counter provides a message signal in accordance with the residual error count remaining in the down counter. The message signal commands a bit pattern generator that applies pulse burst controllably to the count up input or count down input of the up/down counter in accordance with the error count in the down counter so as to tend to reduce the error count in the down counter to zero.

6 Claims, 1 Drawing Figure

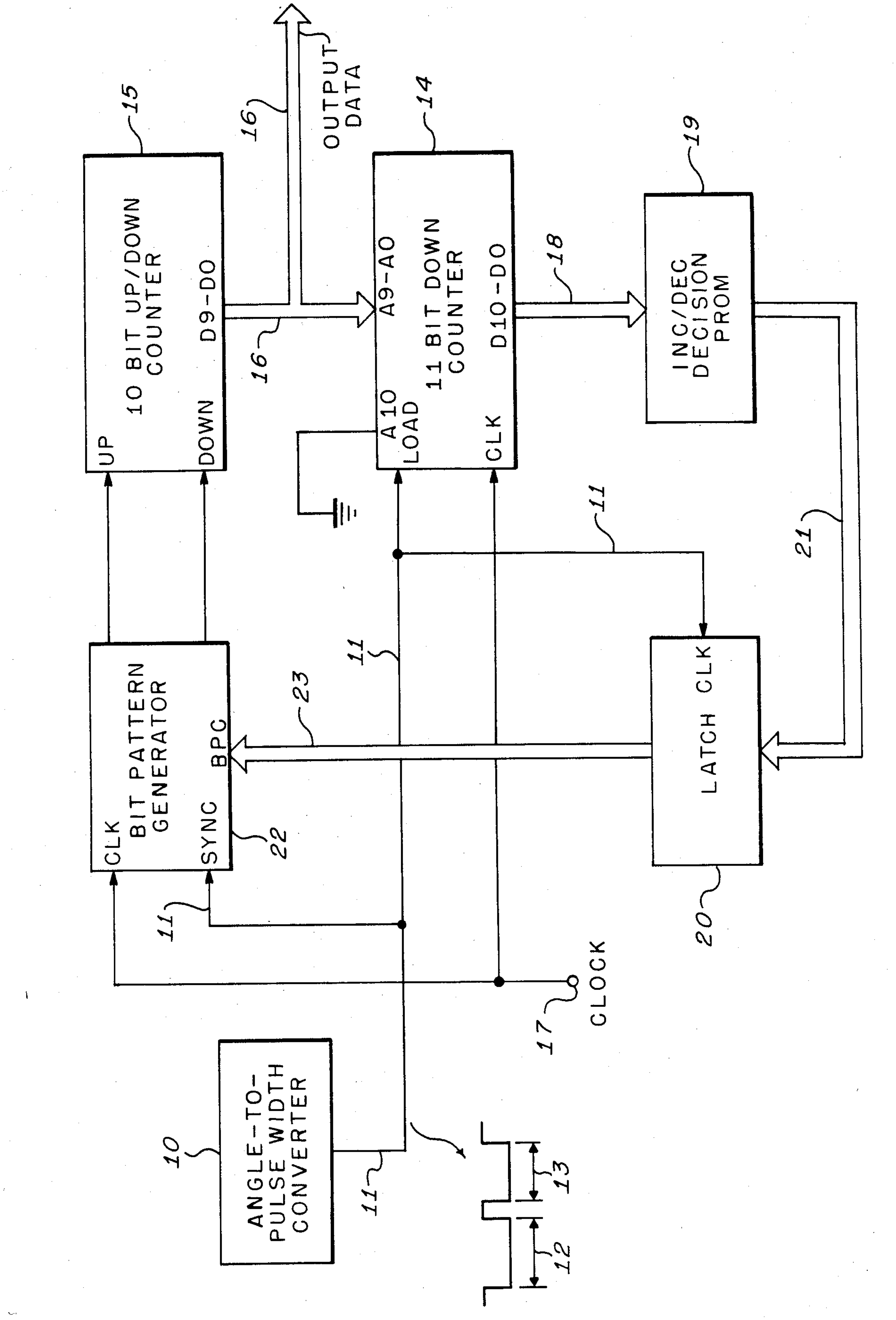
10 BIT UP/DOWN COUNTER
UP
DOWN
D9-D0
OUTPUT DATA
11 BIT DOWN COUNTER
A9-A0
A10 LOAD
CLK
D10-D0
INC/DEC DECISION PROM
BIT PATTERN GENERATOR
CLK
SYNC
BPC
LATCH
CLK
CLOCK
ANGLE-TO-PULSE WIDTH CONVERTER
10
11
12
13
14
15
16
17
18
19
20
21
22
23

TIME INTERVAL TO DIGITAL CONVERTER WITH SMOOTHING

BACKGROUND OF THE INVENTION

1. Field of the Invention

The present invention pertains to time interval to digital converters particularly with respect to smoothing the digital output to eliminate jitter.

2. Description of the Prior Art

It is often desirable in the prior art to convert a time interval to a digital signal. In practical systems in which such a conversion may be utilized, time jitter at the boundaries of the time interval may cause the digital signal to vary erratically resulting in anomalous behaviour in the system. Such time intervals are often represented by pulse width modulated signals where the width of the individual pulses are the time intervals to be converted.

Such conversion of pulse width modulated signals into digital format is encountered in airborne radar systems having an antenna mounted in a radome on the aircraft wherein the antenna scans in a reciprocating sector scan manner. A resolver coupled to the antenna shaft provides AC voltages proportional to the sine and cosine of the azimuth angle of the antenna. These sine and cosine voltages are transmitted to a display unit in the aircraft via shielded wiring. In a well-known manner the sine and cosine signals are converted to a variable width pulse where the pulse width is related to the antenna azimuth angle. The variable width pulse is converted to a digital word by known techniques to address an XY memory utilized to store the radial lines of the received radar information. Each location in the memory corresponds to an incremental azimuth angle. In a typical system, the sine and cosine voltages may be converted into a 10 bit parallel digital azimuth address word which would provide the capability of storing 1.024 radial lines of radar data in the memory. The memory is rapidly read out to drive a CRT display on which the radar data is written in PPI sector scanning manner.

Errors such as noise, hum and mechanical cogging of the antenna result in jitter in the digital addressing word. This jitter disturbs the uniform memory accessing such that radial lines of memory may randomly not be written to. This results in anomalous and undesirable random black radial lines in the CRT display giving the appearance of uneven motion of the antenna. Such uneven motion would result in no data being written to memory from the incremental azimuth angles represented on the lines.

Various techniques have been utilized in the prior art in an attempt to obviate the anomalies caused by jitter. Analog low pass filters to process the sine and cosine signals so as to filter out the jitter signals results in undesirable follow-up delay. Digital signaling techniques may be utilized to convert the antenna azimuth angle into digital format at the antenna. This requires the addition of a significant amount of circuitry to be installed in the hostile environment of the radome. A further technique utilized in the prior art is to slew a counter with a voltage controlled oscillator, the frequency of which being determined by azimuth feedback from the antenna. For example, sine and cosine potentiometers or synchros coupled to the azimuth axis of the antenna may be utilized to provide these signals. Such a technique suffers from the disadvantage that directional reversals of the sector scanning antenna cannot be accurately followed at the end points. Thus, the prior art techniques cannot provide an accurate digital representation of the position at the end points when the antenna is experiencing a reversal from full scanning speed in one direction to full scanning speed in the opposite direction.

SUMMARY OF THE INVENTION

The disadvantages of the prior art are obviated by the time interval-to-digital converter of the present invention wherein the antenna azimuth angle is converted to a variable width pulse and an up/down counter is slewed at a slow rate so that the count stored therein is a digital representation of the width of the pulse. A second counter responsive to the output of the up/-down counter is loaded with a count representative of the up/down counter output. A clock signal is applied to the second counter to count from the value loaded therein during the duration of the next variable width pulse and the final count of the second counter is utilized to increment or decrement the up/down counter so that the output thereof accurately tracks the width of the pulse. Hysteresis may be utilized in this slewing process.

BRIEF DESCRIPTION OF THE DRAWING

The sole FIGURE is a schematic block diagram of a time interval-to-digital converter implemented in accordance with the present invention.

DESCRIPTION OF THE PREFERRED EMBODIMENT

The time interval-to-digital converter illustrated in the FIGURE may be utilized in any application requiring the conversion of a time interval into a digital representation thereof. For purposes of discussion, the converter of the preferred embodiment will be described in terms of providing a parallel digital representation of the azimuth angle of a sector scanning antenna. An angle-to-pulse width converter 10 provides a variable pulse width signal on a line 11 where the negative going pulse width intervals thereof are proportional to the azimuth angle. Two such pulse width intervals are illustrated at 12 and 13 in the FIGURE. The angle-to-pulse width converter 10 may, for example, receive voltages proportional to the sine and cosine of the azimuth angle, for conversion, in a manner well known in the art, into the pulse width modulated signal on the line 11.

The pulse width modulated signal on the line 11 is applied to the load input of an 11 bit down counter 14. The data load port of the counter 14 is denoted as A10-A0, the ten least significant bits A9-A0 thereof receiving the parallel output D9-D0 of a 10 bit up/down counter 15. The count from the counter 15 is applied to the data load port of the counter 14 via a 10 conductor bus 16 which also provides the 10 bit parallel digital output data in a manner to be described. The most significant digit A10 of the data load port of the counter 14 is connected to ground potential. A clock signal at a terminal 17 is applied to the clock input of the counter 14 for controlling the downward counting thereof. Prior to the beginning of a pulse width interval to be converted, the load signal on the line 11 is in a high state and the output data from the counter 15 is continuously loaded to the counter 14. When the pulse width modulated signal on the line 11 goes low at the leading edge of the time interval to be converted, the counter 14 is enabled to count downward toward zero from the count then existing at the data load port A10-A0 thereof.

The 11 bit output D10-D0 from the counter 14 is applied via a bus 18 to address an increment/decrement decision PROM 19. The output of the PROM 19 (Programmable Read Only Memory) is, in the illustrated embodiment, a 3 bit message that is applied to a 3 bit latch 20 via a bus 21. When the pulse width modulated signal on the line 11 goes high at the trailing edge of the pulse width interval to be converted, the counter 14 is placed in the reload mode thereof. Simultaneously, the count remaining in the counter 14 at the end of the time interval to be converted addresses the PROM 19 to generate the 3 bit message on the bus 21. This message is latched into the latch 20 by the rising trailing edge of the pulse width modulated signal. Thus the message on the bus 21, which is generated at the end of the time interval to be converted, is an expression of the count remaining in the counter 14.

It is appreciated that the rising edge of the pulse width modulated signal on the line 11 controls the counter 14 to commence reloading output data into its data load port A10-A0 while it is latching the message on the bus 21 into the latch 20. The correct message will be latched into the latch 20 despite the apparent race condition that exists upon the occurrence of the rising edge of the pulse width modulated signal on the line 11 because of the propagation delays of the PROM 19.

The 3 bit message stored in the latch 20 is applied to a bit pattern generator 22 at the bit pattern command (BPC) input thereof via a bus 23. The bit pattern command on the bus 23 commands the bit pattern generator 22 to generate controlled bursts of pulses and to apply these pulses selectively to the up input or the down input of the counter 15. Thus the output data signal on the bus 16 is maintained as equal as possible to the current width of the pulse width modulated signal on the line 11 in terms of periods of the clock signal applied to the terminal 17. The counter 15, therefore, develops the output data on the bus 16 by being incremented or decremented by the bursts of pulses from the bit pattern generator 22 in a manner to be further explained.

The bit pattern generator 22 also receives the pulse width modulated signal on the line 11 at the sync input thereof as well as the clock signal at the terminal 17 at the clock input thereof. When the pulse width modulated signal on the line 11 is low (during an interval 12 or 13), the bit pattern generator 22 is maintained in a reset state during which no pulses are applied to the counter 15. When the pulse width modulated signal on the line 11 goes high, the pulse bursts are applied controllably to the up or down input of the counter 15 so that the count in the counter 15 tracks the width of the pulses on the line 11. The bit pattern generator 22 may be configured to provide pulse bursts in accordance with the following Table 1:

TABLE 1

| ERROR REMAINING IN COUNTER 14 | MESSAGE (BPC) | CORRECTION TO COUNTER 15 |
|---|---|---|
| 11 or more | 1 1 0 | 8 decrements |
| 2 to 10 | 0 1 0 | 2 decrements |
| 1 | 1 0 0 | 1 decrement |
| 0 | 0 0 0 | No change |
| −1 | 0 1 1 | 1 increment |
| −2 to −10 | 1 0 1 | 2 increments |

TABLE 1-continued

| ERROR REMAINING IN COUNTER 14 | MESSAGE (BPC) | CORRECTION TO COUNTER 15 |
|---|---|---|
| −11 or more | 0 0 1 | 8 increments |

A bit pattern generator suitable for use in the present invention is described in co-pending patent application Ser. No. 939,210 filed 12-8-86 in the names of the present inventors, entitled "Programmable Bit Stream Generator" and assigned to the assignee of the present invention.

In accordance with Table 1 if the error remaining in the counter 14 at the end of a pulse width interval to be converted is 11 or more counts, the PROM 19 converts this count into the bit pattern command message delineated in Table 1 which controls the bit pattern generator 22 to apply 8 pulses to the down input of the counter 15. The bit pattern generator 22 is enabled to provide these pulses when the sync signal goes high. In a similar manner if the error remaining in the counter 14 is −11 or more the bit pattern generator 22 applies 8 pulses to the up input of the counter 15. It is appreciated from Table 1 that if the value in the counter 15 exactly matches the width of the pulse width modulated signal on the line 11, the counter 14 will be at zero at the end of the pulse interval. The PROM 19 will provide a message interpreted in the bit pattern generator 22 as "No change" and the counter 15 will be neither incremented nor decremented. If however the counter 14 is not at zero at the end of the pulse width interval to be converted, the value remaining in the counter 14 represents the error between the value in the counter 15 and the width of the pulse interval to be converted resulting in the PROM 19 generating a message providing the controlled increment or decrement of the counter 15 in accordance with Table 1.

The top and bottom lines of Table 1 represent a slew mode for the device. If the residual errors are above a predetermined threshold (in Table 1 the threshold is 11), the device is operated in a high-speed slew mode that will provide rapid alignment. It is appreciated from Table 1 that when the error is 11 or more, bursts of 8 pulses are utilized to rapidly align the counter 15 with the width of the pulses. This provision is primarily utilized at start-up. The pulses provided by the bit pattern generator 22 to the counter 15 are in synchronism with the clock signal applied to the clock input thereof.

It is appreciated that although the use of the programmable bit stream generator described in said Ser. No. 939,210 is preferable in implementing the bit pattern generator 22, any conventional circuit to provide the function delineated in Table 1 may be utilized. The design of circuits for controllably applying pulse bursts to the up and down inputs of the counter 15 as described in Table 1 is well within the skill of the routineer in the art.

It is appreciated from the foregoing that the apparatus of the FIGURE comprises a digital servo wherein the error signal in the counter 14 results in adjustments to the counter 15 via the bit pattern generator 22 that slave the digital value in the counter 15 to the width of the pulses applied to the line 11. The upward and downward adjustments of the counter 15 are such as to tend to drive the error signal in the counter 14 to zero.

It will be appreciated that errors of 2 to 10 counts all result in 2 increments or decrements to counter 15. Since, in this implementation, the system averages 1.6 counts for each cycle of the pulse width modulated signal 11, the counter 15 can readily follow variations in the input. Since black radial lines are only visible if jumps of more than 4 counts occur, this invention prevents their occurrence by preventing jumps of more than 2 counts.

Hysteresis may be added to the system by simply utilizing additional "No change" messages as follows:

TABLE 2

| ERROR REMAINING IN COUNTER 14 | MESSAGE (BPC) | CORRECTION TO COUNTER 15 |
|---|---|---|
| 11 or more | 1 1 0 | 8 decrements |
| 3 to 10 | 0 1 0 | 2 decrements |
| 2 | 1 0 0 | 1 decrement |
| 1 | 0 0 0 | No change |
| 0 | 0 0 0 | No change |
| −1 | 0 0 0 | No change |
| −2 | 0 1 1 | 1 increment |
| −3 to −10 | 1 0 1 | 2 increments |
| −11 or more | 0 0 1 | 8 increments |

If hysteresis is added pursuant to Table 2, the follow-up between the pulse width modulated signal on the line 11 and the output data on the line 16 will exhibit a small lag. Small anomalous backward excursions, however, in the width of the pulses on the line 11 are less likely to be followed with the added hysteresis than without.

The present invention converts the variable width pulse on the line 11 to a parallel digital word on the bus 16. The rate at which the output data may change is limited and a controlled degree of hysteresis may be added. Thus if the width of the input pulse on the line 11 is increasing or decreasing erratically, the output data on the bus 16 will follow smoothly. Noise and jitter in the pulse width is eliminated by the present invention. The digital servo of the present invention is limited in its follow-up speed thereby providing the advantages discussed herein.

Although the decision PROM 19 is illustrated as a single memory, it is appreciated that the messages on the bus 21 may be generated by two small PROMS. The seven most significant output bits D10-D4 from the counter 14 may be utilized to address the first PROM and the four least significant output bits D3-D0 from the counter 14 may be utilized to address the second PROM. The first PROM would then generate a 4 bit message to be utilized in addressing the second PROM in conjunction with the output from the counter 14. The message from the first PROM to the second PROM could in fact be 2 bits wide but 4 bits may be provided for more flexible programming.

While the invention has been described in its preferred embodiments, it is to be understood that the words which have been used are words of description rather than limitation and that changes within the purview of the appended claims may be made without departure from the true scope and spirit of the invention in its broader asepcts.

We claim:

1. A time interval to digital converter for converting an input signal representative of said time interval to a digital output signal, comprising digital up/down counter means for providing said digital output signal, further digital counter means responsive to said digital output signal and to said input signal for loading said digital output signal therein and counting therefrom during said time interval, thereby providing a digital error signal, and correction means responsive to said digital error signal for controllably incrementing or decrementing said digital up/down counter means in accordance with said digital error signal so that said digital error signal tends toward zero.

2. The converter of claim 1 wherein said digital up/down counter means comprises a digital up/down counter and said digital output signal comprises the parallel digital output thereof.

3. The converter of claim 2 wherein said further digital counter means comprises a digital down counter for loading said parallel digital output signal therein and counting down therefrom during said time interval, the parallel digital output of said digital down counter providing said digital error signal.

4. The converter of claim 3 wherein said up/down counter includes a count up input and a count down input, and said correction means comprises means for controllably applying predetermined numbers of pulses to said count up input or said count down input in accordance with said digital error signal so that said digital error signal tends toward zero.

5. The converter of claim 4 wherein said correction means comprises a decoding memory addressed by said digital error signal for providing bit pattern commands in accordance with said digital error signal, and a bit pattern generator responsive to said bit pattern command for generating said predetermined numbers of pulses and applying said predetermined numbers of pulses controllably to said count up input or said count down input in accordance with said bit pattern command.

6. The converter of claim 1 wherein said input signal comprises a pulse width modulated signal wherein the widths of said pulses represent said time interval.

* * * * *